United States Patent
Goeckner et al.

(10) Patent No.: US 6,433,553 B1
(45) Date of Patent: Aug. 13, 2002

(54) METHOD AND APPARATUS FOR ELIMINATING DISPLACEMENT CURRENT FROM CURRENT MEASUREMENTS IN A PLASMA PROCESSING SYSTEM

(75) Inventors: Matthew J. Goeckner, Plano, TX (US); Charles E. Van Wagoner, San Jose, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/428,264

(22) Filed: Oct. 27, 1999

(51) Int. Cl.[7] .................. G01N 27/62; G01R 31/26; H01J 7/24
(52) U.S. Cl. ................. 324/464; 324/459; 324/765; 315/111.2
(58) Field of Search .................. 324/459, 464, 324/765, 500; 73/19.01, 23.2, 35.08; 118/723 E; 250/492.2; 96/22

(56) References Cited

U.S. PATENT DOCUMENTS

| | | | |
|---|---|---|---|
| 4,335,314 A | * 6/1982 | Geerk et al. | 250/492.3 |
| 4,402,762 A | * 9/1983 | John et al. | 438/482 |
| 4,414,603 A | * 11/1983 | Masuda | 361/227 |
| 4,587,430 A | * 5/1986 | Adler | 250/423 R |
| 4,764,394 A | 8/1988 | Conrad | 427/525 |
| 5,017,876 A | 5/1991 | Wright et al. | 324/464 |
| 5,211,994 A | * 5/1993 | Tsukazaki et al. | 427/523 |
| 5,354,381 A | 10/1994 | Sheng | 118/723 E |
| 5,410,425 A | * 4/1995 | Rhodes | 359/254 |
| 5,572,038 A | 11/1996 | Sheng et al. | 250/492.2 |
| 5,711,812 A | 1/1998 | Chapek et al. | 118/723 E |
| 5,841,235 A | * 11/1998 | Engelko et al. | 315/111.2 |
| 5,897,753 A | * 4/1999 | Schatz et al. | 204/192.1 |
| 6,043,066 A | * 3/2000 | Mangano et al. | 435/173.7 |
| 6,050,218 A | 4/2000 | Chen et al. | 118/723 E |
| 6,136,214 A | * 10/2000 | Mori et al. | 216/67 |

FOREIGN PATENT DOCUMENTS

EP 0994203 A2 4/2000

OTHER PUBLICATIONS

Peter Kellerman, "PIII Dosimetry," Eaton, Implant Systems Division, Apr. 1999, pp. 1–13.
Tian et al, Accurate Determination of Pulsed Current Waveform in Plasma Immersion Ion Implantation Processes J. of Applied Physics, vol. 86, No. 7, Oct., 1999, pp. 3567–3570.

* cited by examiner

Primary Examiner—N. Le
Assistant Examiner—Wasseem H. Hamdan
(74) Attorney, Agent, or Firm—Wolf, Greenfield & Sacks, P.C.

(57) ABSTRACT

In a plasma processing system, displacement current is removed from a current measurement by providing a secondary capacitor connected in parallel with a primary capacitor defined by an anode and a cathode spaced from one another within the plasma doping chamber. The secondary capacitor is chosen or adjusted to have a same or nearly the same capacitance as the primary capacitor. When a voltage pulse is applied to both the primary and secondary capacitors, the respective currents through the capacitors are measured. In order to remove the effects of the displacement current that is present at the leading and falling edges of the voltage pulse, and in order to measure the ion current within the doping chamber, the secondary current through the secondary capacitor is subtracted from the primary current through the primary capacitor.

34 Claims, 10 Drawing Sheets

METHOD AND APPARATUS FOR ELIMINATING DISPLACEMENT CURRENT FROM CURRENT MEASUREMENTS IN A PLASMA PROCESSING SYSTEM

FIELD OF THE INVENTION

This invention relates to plasma doping systems used for ion implantation of workpieces and, more particularly, to methods and apparatus for eliminating the displacement current from current measurements in plasma processing systems.

BACKGROUND OF THE INVENTION

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Exacting requirements are placed on semiconductor fabrication processes involving ion implantation with respect to the cumulative ion dose implanted into the wafer, implant depth, dose uniformity across the wafer surface, surface damage and undesirable contamination. The implanted dose and depth determine the electrical activity of the implanted region, while dose uniformity is required to ensure that all devices on the semiconductor wafer have operating characteristics within specified limits. Excessive surface damage, particularly chemical etch, or contamination of the surface can destroy previously fabricated structures on the wafer.

In some applications, it is necessary to form shallow junctions in a semiconductor wafer, where the impurity material is confined to a region near the surface of the wafer. In these applications, the high-energy acceleration and the related beam forming hardware of conventional ion implanters are unnecessary. Accordingly, it has been proposed to use Plasma Doping (PLAD) systems for forming shallow junctions in semiconductor wafers.

In a plasma doping system, a semiconductor wafer is placed on a conductive platen located in a chamber, and the platen functions as a cathode. An ionizable gas containing the desired dopant material is introduced into the chamber, and a high voltage pulse is applied between the platen and the anode (or the chamber walls) causing the formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the plasma doping system described above, the high voltage pulse generates the plasma and accelerates positive ions from the plasma toward the wafer. In other types of plasma implantation systems, known as Plasma-Source Ion Implantation, PSII, systems, a separate plasma source is used to provide a continuous plasma. (These implantation systems are also known by several other acronyms, the most common being Plasma-Immersion Ion Implantation, PIII) In such systems, the platen and the wafer are immersed in this continuous plasma and, at intervals, a high voltage pulse is applied between the platen and the anode, causing positive ions in the plasma to be accelerated toward the wafer. Such a system is described in U.S. Pat. No. 4,764,394, issued Aug. 16, 1988 to Conrad.

Both PLAD and PSII systems require accurate dose measurement to achieve high-quality semiconductor devices. One approach to dose measurement in plasma doping systems involves measurement of the current delivered to the workpiece by the high voltage pulses, as described in the aforementioned U.S. Pat. No. 5,354,381. However, this approach is subject to inaccuracies. The measured current includes electrons generated during ion implantation and excludes neutral molecules that are implanted into the workpiece, even though these neutral molecules contribute to the total dose. Furthermore, since the measured current passes through the wafer being implanted, it is dependent on the characteristics of the wafer, which may produce errors in the measured current. Those characteristics include emissivity, local charging, gas emission from photoresist on the wafer, etc. Thus, different wafers may give different measured currents for the same ion dose.

A technique for dosimetry on a plasma based doping system is described by E. Jones et al. in *IEEE Transactions on Plasma Science*, Vol. 25, No. 1, February 1997, pp. 42–52. Measurements of implant current and implant voltage are used to determine an implant profile for a single implant pulse. The implant profile for a single pulse is used to project the final implant profile and total implanted dose. This approach is also subject to inaccuracies, due in part to the fact that it depends on power supply and gas control stability to ensure repeatability. Furthermore, the empirical approach is time consuming and expensive.

In comparison, typically in known beamline implantation systems, cumulative ion dose and uniformity are measured with Faraday cups, or a Faraday cage. The Faraday cage is typically a conductive enclosure, often with the wafer positioned at the downstream end of the enclosure and constituting part of the Faraday system. The ion beam passes through the Faraday cage to the wafer and produces an electrical current. The Faraday current is supplied to an electronic dose processor, which integrates the current with respect to time to determine the total ion dosage. The dose processor may be part of a feedback loop that is used to control the ion implanter.

Dose and dose uniformity have also been measured in conventional beamline ion implantation systems using a corner cup arrangement as disclosed in U.S. Pat. No. 4,751,393 issued Jun. 14, 1988 to Corey, Jr. et al. As discussed in the '393 patent, a mask having a central opening is positioned in the path of the ion beam. The beam is scanned over the area of the mask with the portion passing through the central opening impinging on the wafer. Small Faraday cups located at the edge of the mask measure the beam current at these locations.

There is a need for accurate measurements of the ion current being delivered to a target in a PLAD or PSII system. The ion current must be properly measured, so that proper process conditions can be maintained. Regardless of the method of measuring current applied to the target, the measured current pulse includes capacitive, or displacement, current components that introduce errors in the measurement. This displacement current is the current observed when a capacitor, or any structure with capacitance, is subject to a rapid increase/decrease in the applied voltage. This current is required to provide the charge that maintains the relation $V=Q/C$, where V is the instantaneous applied voltage, C is the capacitance and Q is the instantaneous charge stored in the capacitor. In either a PLAD or PSII system, the cathode and anode together can be considered to be a capacitor C that is charged and discharged by the applied pulse. A Faraday cup, or similar current measurement tool, also has a capacitance and the measured current includes a displacement current. The current measurement signals generated by a Faraday cup, or similar measurement tool, are much smaller than other current measurements, since they represent only a portion of the current the workpiece is receiving. The capacitance of the Faraday cup is also smaller than the capacitance of the anode and the cathode, but not in the same proportion as the measured currents. As a result, the displacement current is a larger proportion of the total current measured by the Faraday cup. Also, since the signal-to-noise ratio is lower for Faraday cup measurements, the presence of displacement currents is less desirable. Thus, it is more important that the displacement current in Faraday cup measurements be removed.

Conventionally, the displacement current at the leading and trailing edges of the pulse is ignored. Unfortunately, in many applications, the voltage pulse lengths are in the range of twenty $\mu$s (microseconds). The typical rise time of the pulse is about three $\mu$s while the fall time is about seven $\mu$s. Since the displacement current is observed during the rise and fall times, it contributes to ion current measurement errors over a significant proportion of the voltage pulse.

The displacement current contributes to an inaccurate measurement of ion current in a plasma processing system. Accurate measurement of the ion current is necessary to efficiently operate the system. Therefore, a way to reduce or eliminate the errors in ion current measurements which are caused by displacement current is needed.

SUMMARY OF THE INVENTION

According to a first aspect of the invention, a method of measuring an ion current in a plasma processing system including first and second electrodes, wherein a voltage pulse is applied across the first and second electrodes is provided. The method comprises electrically coupling a capacitor between the first and second electrodes to receive the voltage pulse; measuring a first current supplied to the first and second electrodes during the voltage pulse and providing a first current signal representative of the first current; measuring a second current supplied to the capacitor during the voltage pulse and providing a second current signal representative of the second current; and subtracting the second current signal from the first current signal to provide an ion current signal representative of the ion current.

The capacitor may have a same or nearly the same capacitance as a first capacitance between the first and second electrodes. Alternately, the capacitor may have a capacitance different from a first capacitance between the first and second electrodes; and the method includes adjusting at least one of the first and second current signals to compensate for the difference in capacitance.

In another variation, a target is disposed on the first electrode and the step of providing the first current signal comprises placing an ion detecting device adjacent the target to generate the first current signal, selecting a capacitor having a capacitance different from a capacitance of the ion detecting device; and adjusting at least one of the first and second current signals to compensate for the difference between the two capacitances. Alternately, the method comprises selecting a capacitor having a capacitance substantially the same as a capacitance of the ion detecting device.

According to another aspect of the present invention, an apparatus for measuring ion current in a plasma processing system wherein a voltage pulse is applied across first and second electrodes is provided. The apparatus comprises a capacitive device coupled to the first and second electrodes to receive the voltage pulse; first means for measuring a first current supplied to the first and second electrodes during the voltage pulse and for providing a first current signal representative of the first current; second means for measuring a second current supplied to the capacitive device during the voltage pulse and for providing a second current signal representative of the second current; and means for subtracting the second current signal from the first current signal to provide a measurement of the ion current in the plasma processing system.

In another aspect of the present invention, a method of measuring an ion current in a plasma processing system including first and second electrodes in a processing chamber is provided. The method comprises measuring a pulsed current through the chamber and providing a pulsed current signal that is representative of the pulsed current; providing a compensation signal that is representative of a displacement current component of the pulsed current; and subtracting the compensation signal from the pulsed current signal to provide an ion current signal that is representative of ion current delivered to a target.

In a variation of this aspect, the step of providing a compensation signal comprises simulating the displacement current component of the pulsed current. Alternately, the step of providing a compensation signal comprises: providing a capacitor having a capacitance that is the same or nearly the same as a capacitance between the first and second electrodes, applying a pulsed voltage to the capacitor in synchronism with the pulsed current, and measuring a second current supplied to the capacitor in response to the pulsed voltage and providing a second current signal that constitutes the compensation signal.

BRIEF DESCRIPTION OF THE DRAWINGS

For a better understanding of the present invention, reference is made to the accompanying drawings, in which like reference numbers designate the same element and in which.

DETAILED DESCRIPTION

Figure 1:
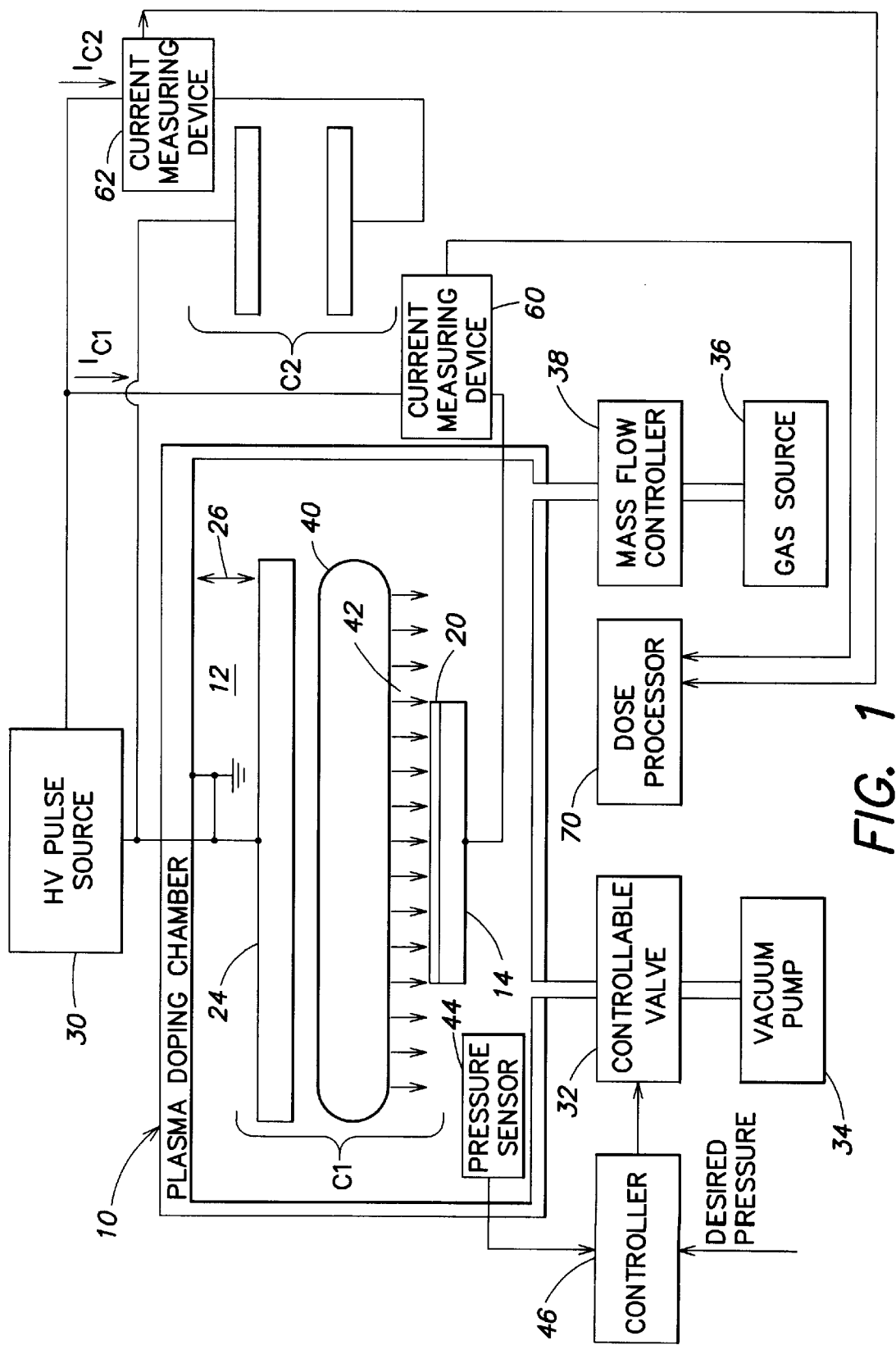
FIG. 1 is a schematic block diagram of a plasma doping system in accordance with a first embodiment of the present invention.

An example of a plasma doping system in accordance with a first embodiment of the present invention is shown schematically in FIG. 1. A plasma-doping chamber 10 defines an enclosed volume 12. A platen 14 positioned within chamber 10 provides a surface for holding a workpiece, such as a semiconductor wafer 20. Semiconductor wafers are only one example of possible target types. The invention is not limited to ion implantation in only semiconductor wafers. For example, implantation in metals for tools, automotive components, stamping dies, and plastics are also possible. The wafer 20 may, for example, be clamped at its periphery to a flat surface of platen 14. The platen 14 supports wafer 20 and provides an electrical connection to wafer 20. In one embodiment, the platen has an electrically-conductive surface for supporting wafer 20. In another embodiment, the platen includes conductive pins for electrical connection to wafer 20.

An anode 24 is positioned within chamber 10 in spaced relation to the platen (cathode) 14. Anode 24 may be movable in a direction, indicated by arrow 26, perpendicular to platen 14. The anode 24 is typically connected to electrically-conductive walls of the chamber 10, both of which may be connected to ground.

The cathode 14 and, therefore, the wafer 20, are connected to a high voltage pulse generator 30. The pulse generator 30 typically provides pulses in a range of about 100 to 10,000 volts, about 1 to 100 microseconds in duration and at a pulse repetition rate of about 50 Hz to 5 KHz. It will be understood that these pulse parameter values are given by way of example only and that other values may be utilized within the scope of the invention.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr (mtorr) to about 500 mtorr, but is not limited to this range. Gas source 36 supplies an ionizable gas containing a desired dopant for implantation into the workpiece. Examples of ionizable gases include $BF_3$, $N_2$, Ar, $PF_5$ and $B_2H_6$. It will be understood that these gases are given by way of example only and that other gases may be utilized within the scope of the invention. Mass flow controller 38 regulates the rate at which gas is supplied to the chamber 10. The configuration shown in FIG. 1 provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 are set to produce the desired pressure and gas flow rate within chamber 10. By way of example, the chamber 10 may operate with $BF_3$ gas at a pressure of ten mtorr. The pulse generator 30 applies a series of high voltage pulses to wafer 20, causing formation of a plasma 40 between wafer 20 and anode 24. As is known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14. Secondary electrons that are produced by the ion impact on the platen 14 and wafer 20 are accelerated back across the sheath 42 and into the plasma 40. The accelerated ions are implanted into wafer 20 to form regions of impurity material. The pulse voltage is selected to implant the positive ions to a desired depth in wafer 20. The number of pulses and the pulse duration are selected to provide a desired dose of impurity material (the positive ions) in wafer 20. The current per pulse is a function of pulse voltage, gas pressure and species and any variable position of the electrodes. For example, the cathode to anode spacing may be adjusted for different voltages.

In the plasma doping system, the pulsed current is measured to provide a pulsed current signal that is indicative of ion current delivered to the wafer.

The pulsed current through the plasma doping system is a sum of an ion current, a secondary electron current and a displacement current. In accordance with an aspect of the invention, a compensation signal is produced that is representative of the displacement current component of the pulsed current. The compensation signal is subtracted from the pulsed current signal to provide an ion current signal that is representative of the ion current delivered to the wafer.

In one embodiment, the present invention makes use of a secondary capacitor that preferably has the same, or very similar, capacitance as the plasma system electrodes, i.e., the anode, including the chamber walls, and the cathode, which constitute a primary capacitor. By applying the same or a similar voltage pulse to the secondary capacitor, a secondary displacement current, which is identical, or very similar, to a primary displacement current in the primary capacitor, is produced. As noted above, the primary current is a sum of an ion current, a secondary electron current and the primary displacement current. Thus, subtracting the secondary displacement current (which is substantially equal to the primary displacement current) from the primary current results in an accurate measurement of the ion current plus the secondary electron current. In one embodiment of the present invention, the secondary capacitor can be a variable capacitor that can be varied to match the capacitance of the plasma system.

Figure 2:
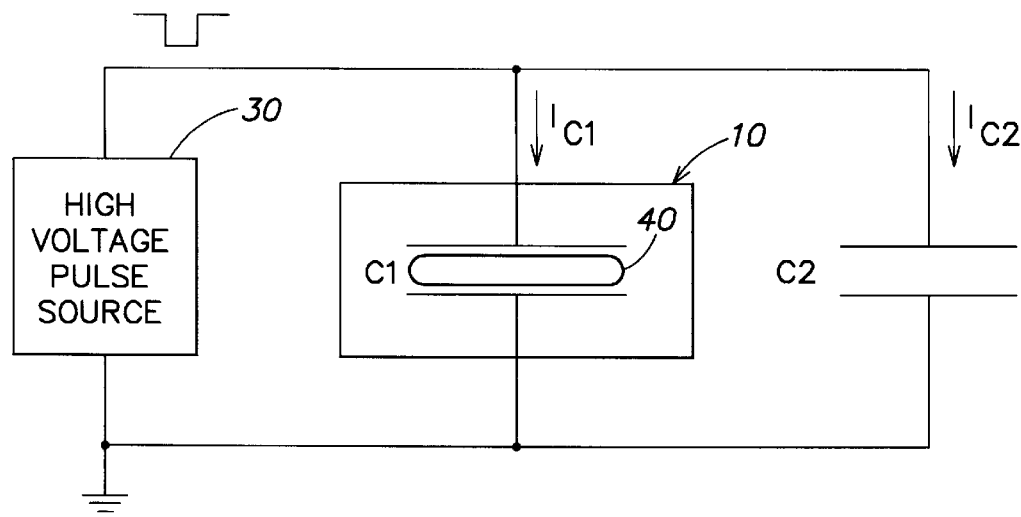
FIG. 2 is a simplified schematic diagram of the plasma doping system of FIG. 1.

As shown in FIG. 1, the complete anode structure, consisting of anode 24 and chamber walls 10, and the platen (cathode) 14 of the plasma doping system can be considered as constituting a primary capacitor C1. A secondary capacitor C2 is coupled between ground and the output of the pulse source 30. The secondary capacitor C2 is preferably selected to have the same or similar capacitance as that of the primary capacitor C1. Effectively, the primary capacitor C1 and the secondary capacitor C2 are connected in parallel. This circuit is shown in FIG. 2. As can be seen, the high voltage pulse from the pulse source 30 is applied to both capacitors C1 and C2.

A first current measuring device 60 is provided to measure the current through the primary capacitor C1 and to output this measurement to a dose processor 70. A second current measuring device 62 is provided to measure the current through the secondary capacitor C2. The output of the current measuring device 62 is also provided to the dose processor 70.

The current measuring devices 60, 62 can either be the same type of device or different devices. In one preferred embodiment, a Pearson coil is used to measure the current through each capacitor during the pulse. There are, however, many different types of current measurement devices currently available. Any one of these devices can be used to measure the currents.

In operation, when the pulse is applied to the two capacitors, a primary current $I_{C1}$ is produced in the primary capacitor C1 and a secondary displacement current $I_{C2}$, that is substantially identical, or at least very similar, to the primary displacement current component of primary current $I_{C1}$ is produced in the secondary capacitor C2. By subtracting the secondary displacement current from the primary current, a more accurate measurement is made of the ion current and secondary electron current being delivered to the target. The more accurate measurement of these currents results in better process control and repeatability.

Figure 3:
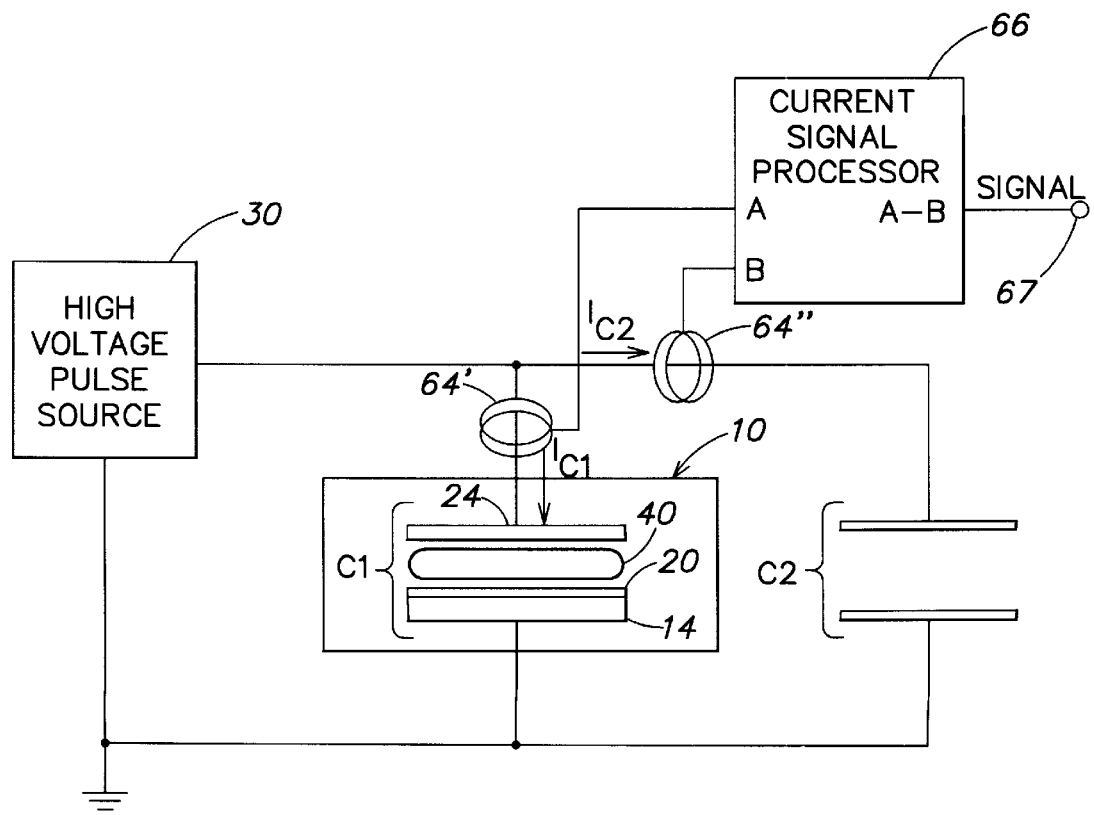
FIG. 3 is a schematic block diagram of the plasma doping system in accordance with the first embodiment of the present invention.

In one embodiment of the present invention, as shown in FIG. 3, the current measuring device 60 is a first Pearson coil 64' and the current measuring device 62 is a second Pearson coil 64". An output of the first Pearson coil 64' is provided to a first input A of a current signal processor 66. An output of the second Pearson coil 64" is provided to a second input B of the current signal processor 66. An output 67 of the current signal processor 66 represents the measured current through the primary capacitor C1 minus the measured current through the secondary capacitor C2. As a result, the displacement current has been removed from the primary current measurement.

One of ordinary skill in the art can see that there are many devices and circuits that can function as the current signal processor 66. For example, a circuit using an operational amplifier may be implemented to provide an analog difference signal. Any necessary signal conditioning functions may also be utilized. Further, the current signal processor 66 may be a digital device where the signals $I_{C1}$ and $I_{C2}$ are converted from analog to digital format, and the difference calculation is then performed in the digital domain.

The function of the current signal processor 66, i.e., subtracting the current in the secondary capacitor C2 from the current in the primary capacitor C1, can be performed either by the processor 66 or within the dose processor 70 (FIG. 1).

Figure 4:
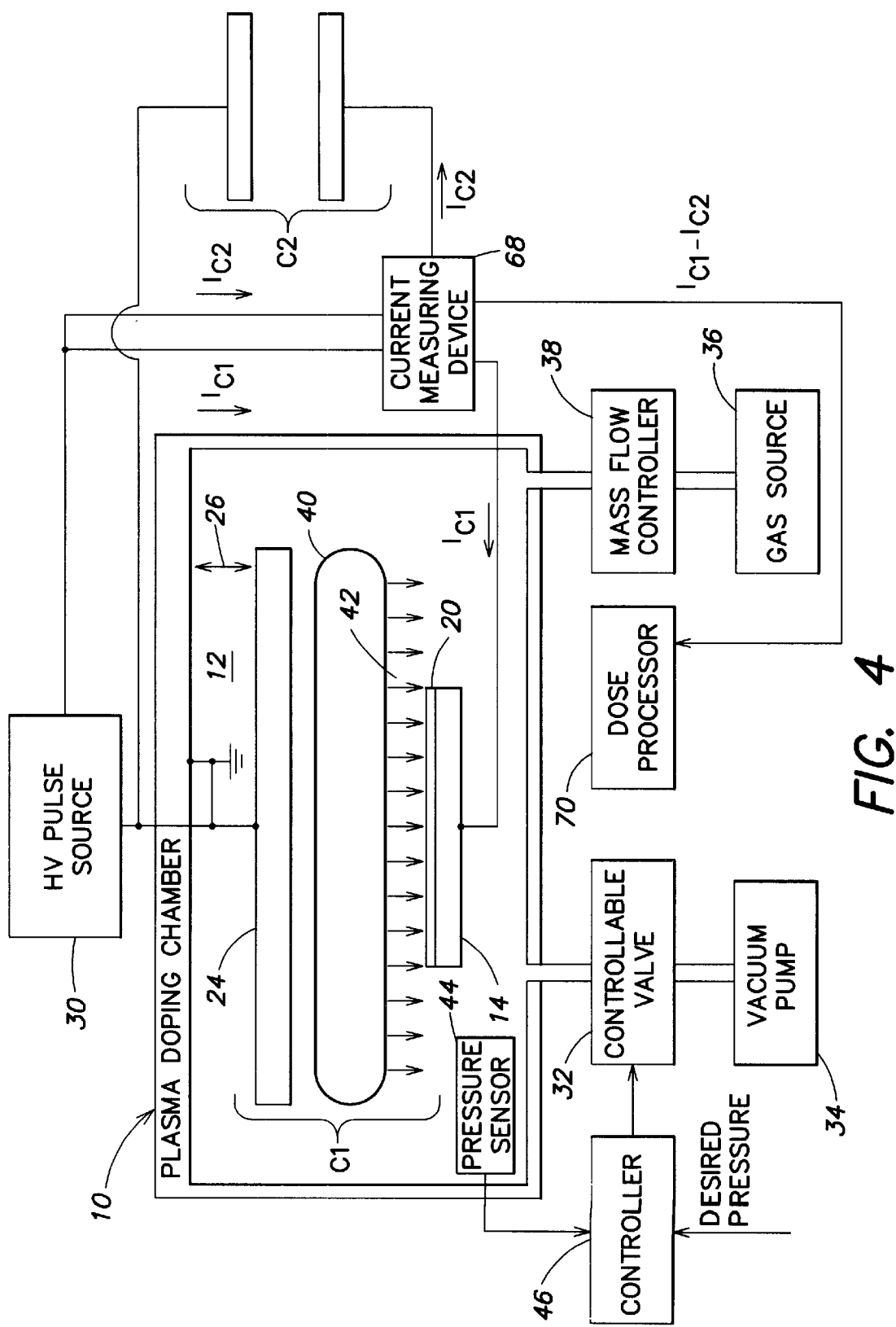
FIG. 4 is a schematic block diagram of a plasma doping system in accordance with a second embodiment of the present invention.

In another embodiment of the present invention, as shown in FIG. 4, a single current measuring device 68 is utilized to measure the primary current $I_{C1}$ through the primary capacitor and the secondary current $I_{C2}$ through the secondary capacitor and to output a signal to the dose processor 70 representative of the primary current minus the secondary current. As shown in FIG. 4, the device 68 is configured so that both currents $I_{C1}$, $I_{C2}$ pass through it.

Figure 5:
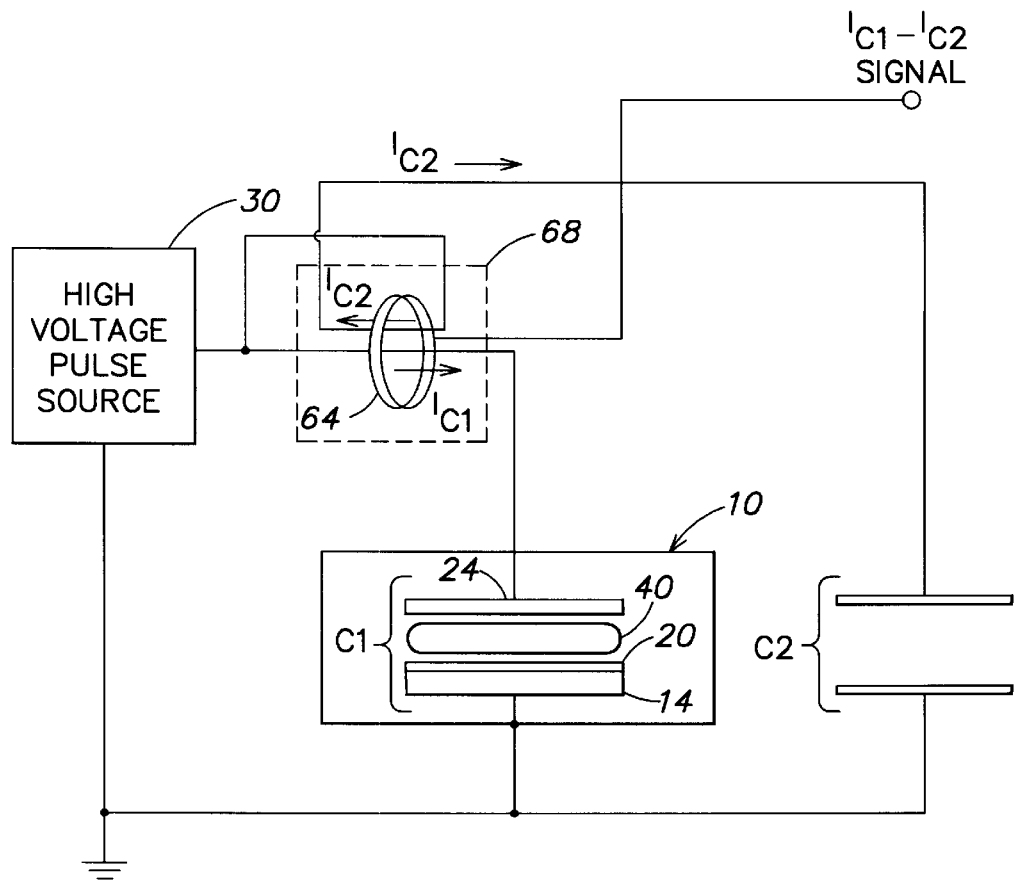
FIG. 5 is a schematic block diagram of the plasma doping system in accordance with the second embodiment of the present invention.

The current measuring device 68 may comprise a single Pearson coil 64 as shown in FIG. 5. As shown, a wire carrying the primary current $I_{C1}$ to the primary capacitor C1 passes through the Pearson coil 64 in a first direction (left to right). The wire carrying the secondary current $I_{C2}$ to the secondary capacitor C2 passes in a second direction (right to left) through the Pearson coil 64, such that the secondary current $I_{C2}$ passes through the Pearson coil 64 in a direction opposite to that of the primary current $I_{C1}$. The output of the Pearson coil 64 is then the difference between the primary current and the secondary current ($I_{C1}-I_{C2}$).

Figure 6:
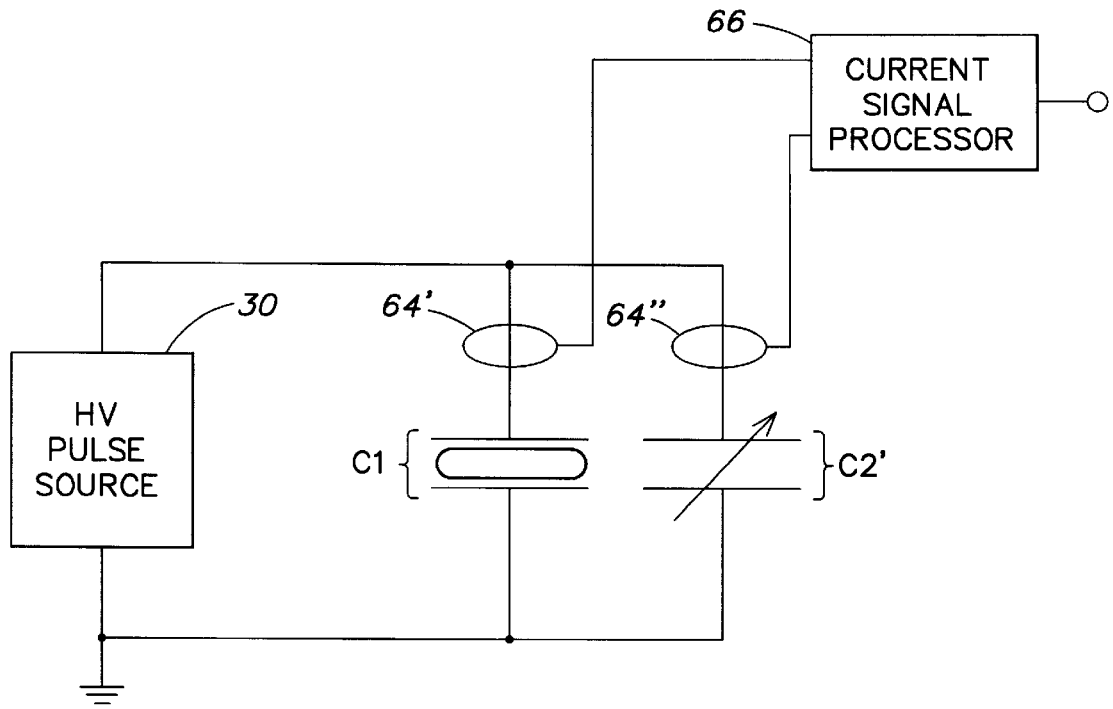
FIG. 6 is a simplified schematic diagram of a third embodiment of the present invention.

As described above, the secondary capacitor C2 preferably is selected to have the same capacitance as the primary capacitor C1. In order to provide more flexibility, the secondary capacitor C2 advantageously may be an adjustable capacitor. As shown in FIG. 6, a simplified schematic of the present invention, the secondary capacitor has been replaced with an adjustable capacitor C2'. The capacitance of the capacitor C2' may be adjusted to be the same as that of primary capacitor C1, as described below. This provides flexibility as well as fine-tuning capabilities in the event that the capacitance of the primary capacitor C1 changes.

In order to minimize "ringing" and noise on the line carrying the current to the secondary capacitor C2, C2', any number of different noise-reduction techniques, well known to those of ordinary skill in the art, can be applied. Components such as capacitors, inductors, high-pass, band-pass, low-pass filters and/or one or more resistors may be used. The parameters for selecting these components in order to improve the signal quality include choosing the resistance, capacitance, inductance, frequency range and frequency response characteristics, which can be fixed or variable.

Figure 7:
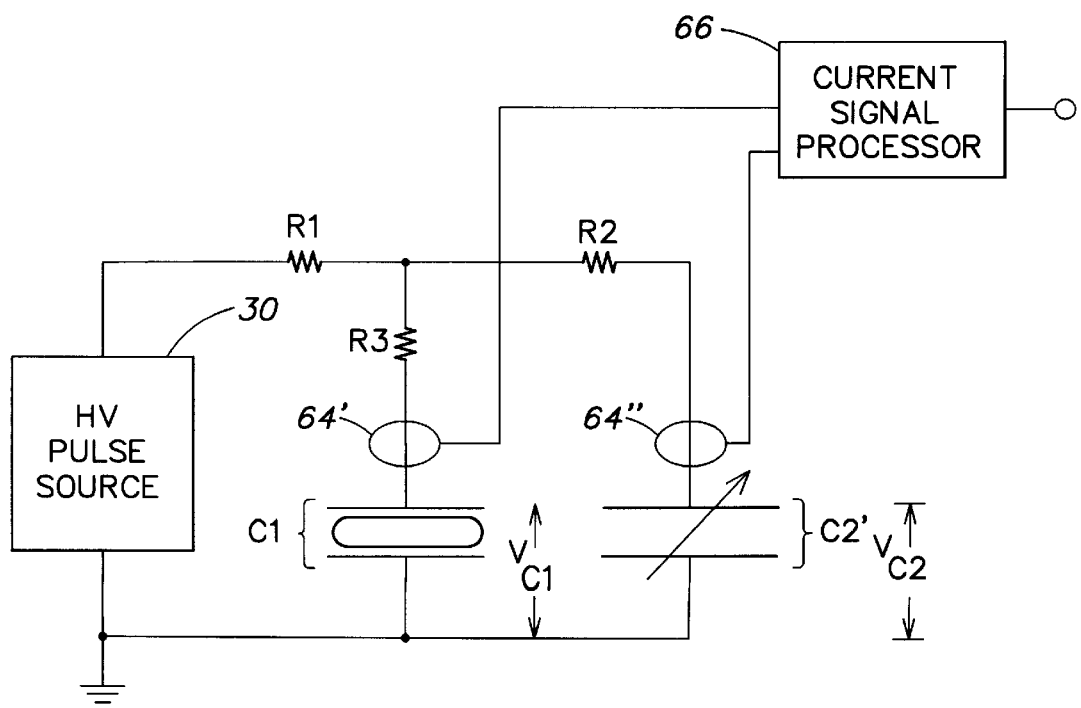
FIG. 7 is a simplified schematic diagram of a fourth embodiment of the present invention.

In one example, as shown in FIG. 7, a resistor R2 is connected in series with the secondary capacitor C2' and the series-coupled resistor R2 and secondary capacitor C2' are coupled in parallel with the primary capacitor C1 in series with a resistor R3.

While the simplified schematic shown in FIG. 7 reflects the use of an adjustable capacitor C2', the resistors can be provided in the embodiments discussed above, where a fixed capacitor C2 is used. In addition, a resistor R1 can be provided in series with the output of the high voltage pulse source 30. Further, the particular values of these resistors can be chosen by one of ordinary skill in the art to minimize ringing. Still further, variable resistors (not shown) can be used to adjust the resistance value similar to the ability to adjust the capacitance value of the adjustable capacitor C2'. One of ordinary skill in the art will understand that the resistors and capacitors C2, C2' must be selected to have the proper voltage and power ratings for the implementation.

It should be noted that measures taken to improve the signal quality of $I_{C1}$ and $I_{C2}$ may result in a voltage $V_{C1}$ on the primary capacitor $C_1$ being different from a voltage $V_{C2}$ on the secondary capacitor C2. This may result in different displacement currents in capacitor C1 and capacitor C2. Accordingly, this voltage difference must be compensated for, as known to one of ordinary skill in the art, either within the current signal processor 66 or by other methods.

Figure 12:
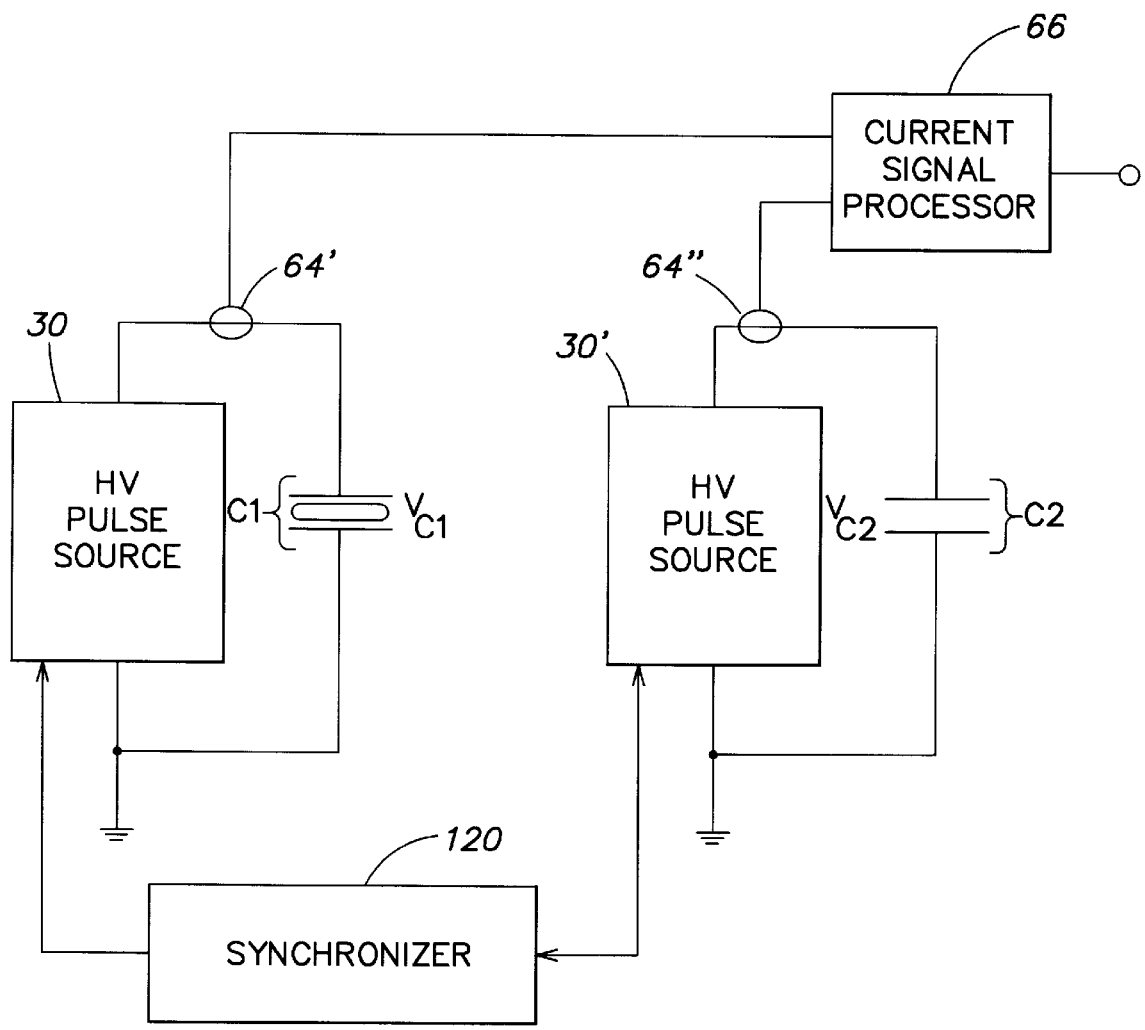
FIG. 12 is a schematic block diagram of a plasma doping system in accordance with a sixth embodiment of the present invention.

In another embodiment of the present invention shown in FIG. 12, a second high voltage pulse source 30', synchronized with source 30 by a synchronization device 120, is used to apply a pulse to capacitor C2 that is substantially the same, with respect to voltage amplitude, pulse width, rising edge timing and falling edge timing, as the pulse applied to the primary capacitor C1. High voltage pulse source 30 is connected to the primary capacitor C1. Second high voltage pulse source 30' outputs a pulse, that is essentially the same and in synchronization with the pulse output of the high voltage pulse source 30, to a secondary capacitor C2 having substantially the same capacitance value as the primary capacitor C1. The measurement of the currents in the two capacitors C1, C2 and the subtraction of the displacement current is then performed as described above. In addition, a variable capacitor and noise reducing techniques can be applied to this embodiment.

In the foregoing description of the present invention, the capacitance of the secondary capacitor C2 is matched to the capacitance of the primary capacitor C1. While it may be possible to measure the capacitance of the primary capacitor C1 in a plasma doping system, there are so many variables inherent in the process that it may be difficult to measure this capacitance and to adjust the secondary capacitor to the measured capacitance.

One method known to the inventors for setting the secondary capacitor C2 to substantially the same value as the primary capacitance C1, is to "tune" the system. The tuning can occur with plasma present in the system or without plasma being present.

Figure 8A:
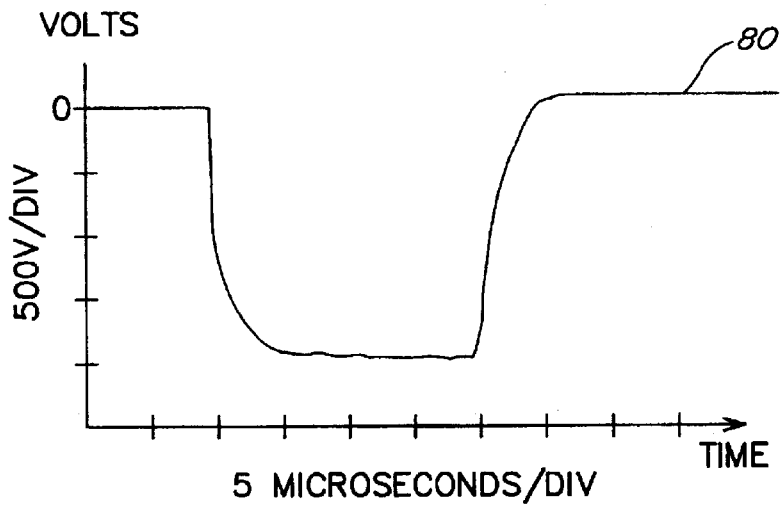
FIGS. 8A and 8B are graphs showing a voltage pulse and current through a conventional plasma doping system with plasma as a function of time.
Figure 8B:
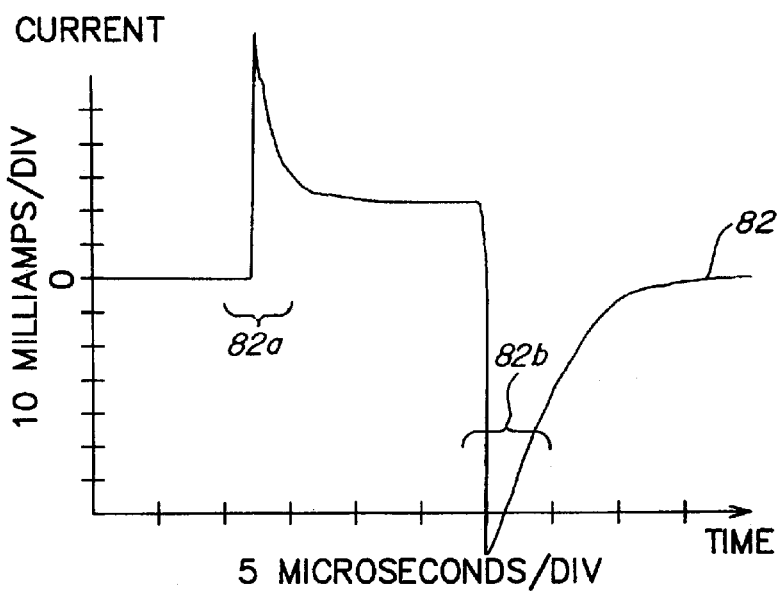

An example of tuning of the plasma doping system with plasma present will now be described. The pressure within the chamber is set sufficient to support a plasma with a pulse frequency of 500 Hz and a pulse duration of twenty $\mu$s. As shown in FIG. 8A, waveform 80 represents the voltage pulse of approximately 2.5 kilovolts having a duration of approximately twenty $\mu$s. Without the secondary capacitor in place, the current measured through the system is shown by waveform 82 in FIG. 8B. As can be seen, the current waveform 82 includes displacement currents 82a and 82b at the leading and trailing edges of the pulse.

Figure 9A:
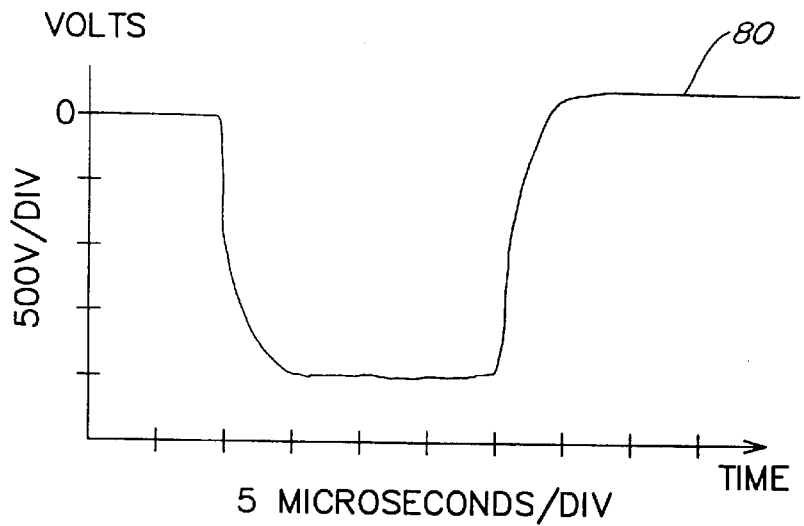
FIGS. 9A and 9B are graphs showing the voltage pulse and the current as a function of time when tuning a system with plasma according to the present invention.
Figure 9B:
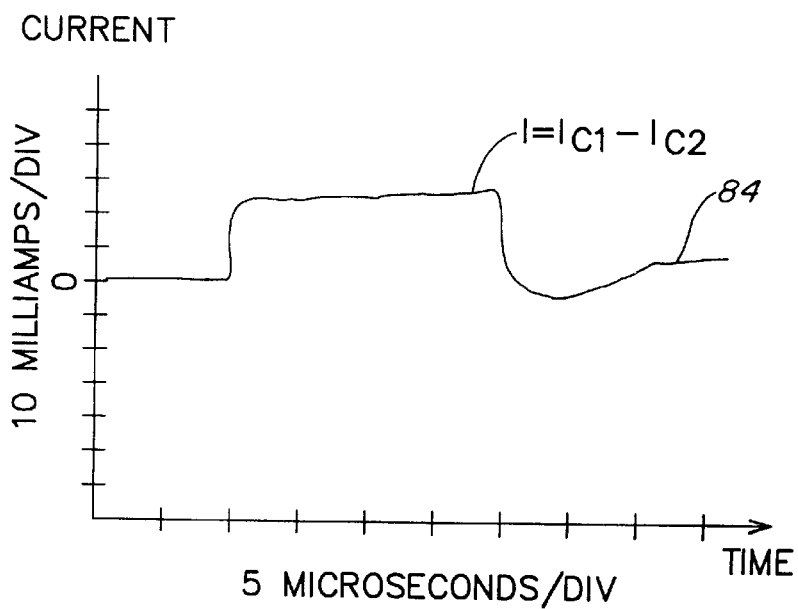

In order to tune the system, the secondary capacitor C2 is connected in parallel with the primary capacitor C1. Preferably, adjustable capacitor C2' is used. The system is then configured to display the primary current through the primary capacitor C1 minus the secondary current through the secondary capacitor C2. As shown in FIG. 9A, the voltage pulse 80, as before, is displayed. A current pulse waveform 84 which is representative of $I_{C1}-I_{C2}$ is shown in FIG. 9B. The secondary capacitor C2' is adjusted to reduce the displacement current observed in the waveform 84. When the observed displacement current in the waveform 84 has been reduced to or near zero, the system, according to the present invention, has been tuned such that the secondary capacitor C2' now has substantially the same capacitance value as the primary capacitor C1. In a test run by the inventors, the required value was approximately sixty-eight picofarads for a laboratory plasma doping system.

Figure 11A:
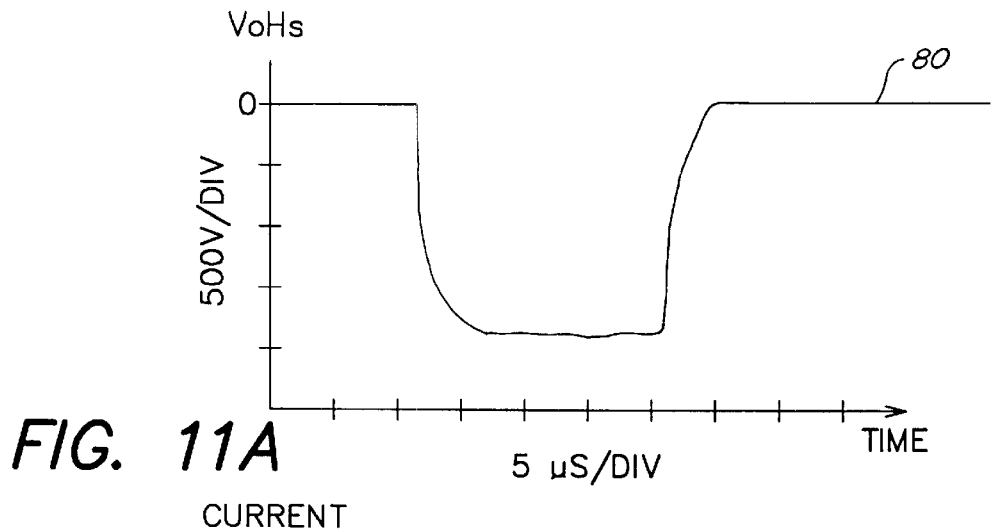
FIGS. 11A, 11B and 11C are graphs showing the voltage pulse and the current as a function of time when tuning a system without plasma according to the present invention.
Figure 11B:
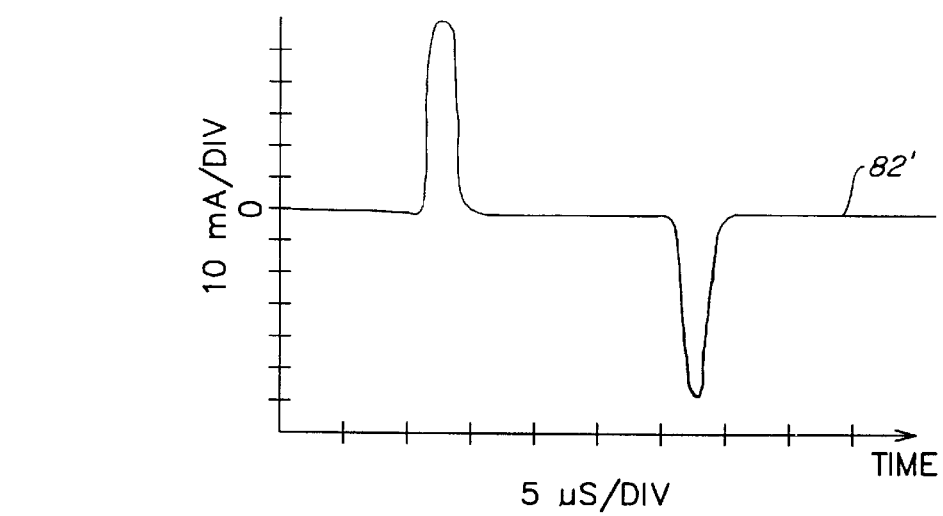
Figure 11C:
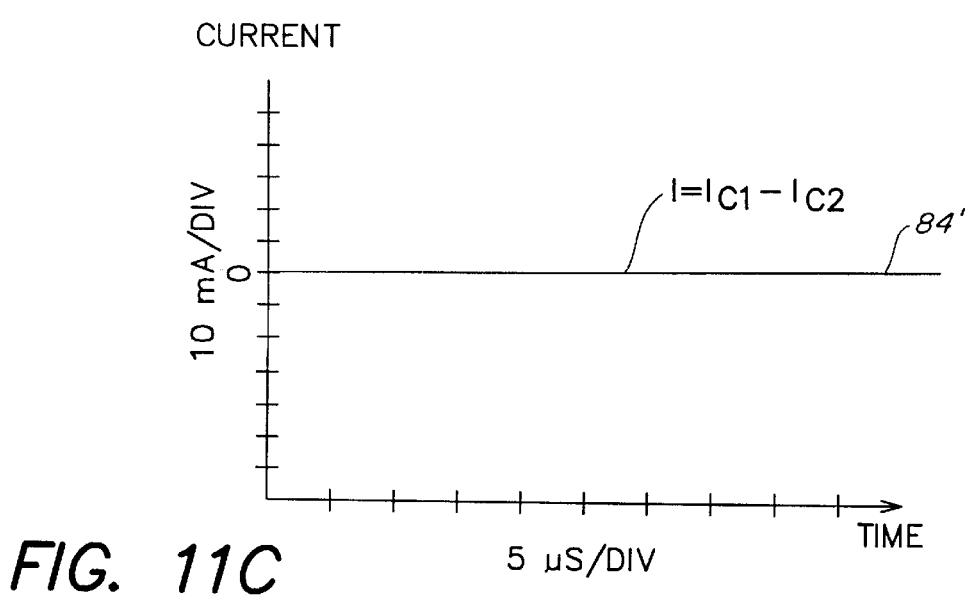

A similar procedure may be applied when tuning a plasma processing system without plasma present. Specifically, a voltage pulse represented by waveform 80, as shown in FIG. 11A, is applied. As there is no plasma in this system, the measured current as shown by waveform 82' in FIG. 11B, includes displacement current but no ion current or secondary electron current, without the secondary capacitor in place. The secondary capacitor C2 is adjusted to reduce the displacement current observed in the waveform 84', which is representative of $I_{C1}-I_{C2}$, as shown in FIG. 11C. When the observed displacement current, as indicated by waveform 84', has been reduced to or near zero, the system has been tuned by setting the secondary capacitor C2' to have substantially the same capacitance value as the primary capacitor C1.

The foregoing provides a method for tuning or calibrating the system to eliminate the displacement current from the current measurement. One of ordinary skill in the art will recognize that there are many different ways to tune the system in addition to using an adjustable capacitor. For example, multiple capacitors may be connected in a parallel and/or series combination in order to change the overall capacitance of the secondary capacitor. The inventors have tuned the secondary capacitor C2 by observing the displacement current waveform and manually adjusting the secondary capacitor's value until the displacement current has been minimized. It is known that this tuning operation can be performed under control of a computer and a signal processing system for controlling the pulse source and the value of the secondary capacitor. The programming of such a computer and arrangement of the components necessary is well within the capability of one of ordinary skill in the art and is included within the scope of the present invention. Further, a computer is not necessary, as an analog circuit may be configured to obtain the same results.

As described above, an electrical signal representative of the ion current plus secondary electron current is supplied to the dose processor 70. In one embodiment, the electrical current from each current measuring device 60, 62 is supplied directly to the dose processor 70 located external to chamber 10. The dose processor then performs the subtraction operation. In another embodiment, the current subtraction is performed externally to the dose processor 70.

The total ion dose delivered to wafer 20 is the instantaneous ion current integrated over the time of the implant. Dose processor configurations are known in connection with beamline ion implanters. While the previous embodiments measure the primary current externally to the doping chamber 10, the primary current may be measured within the chamber. In co-pending and commonly assigned U.S. patent application Ser. No. 09/128,370, filed Aug. 3, 1998, entitled "Dose Monitor for Plasma Doping System," which is hereby incorporated by reference in its entirety, one or more Faraday cups are positioned within the chamber 10 to measure the ion current delivered to the target.

Figure 10:
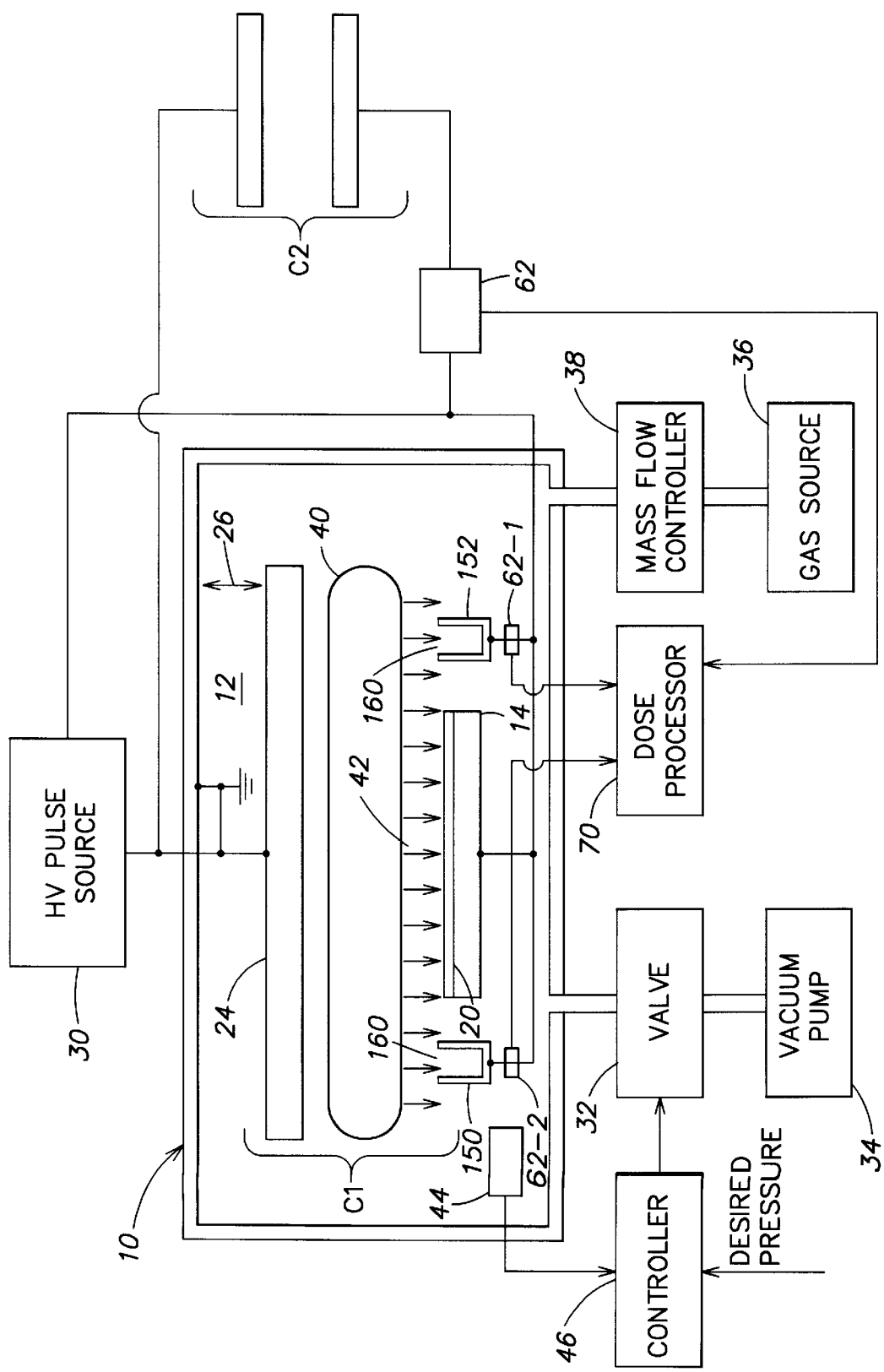
FIG. 10 is a schematic block diagram of a plasma doping system in accordance with a fifth embodiment of the present invention.

As shown in FIG. 10, Faraday cups 150, 152 are spaced around the periphery of wafer 20. Each Faraday cup comprises a conductive enclosure having an entrance 160 facing plasma 40. Each Faraday cup is preferably positioned as close as is practical to wafer 20 and intercepts a sample of the positive ions accelerated from plasma 40 toward platen 14. Each Faraday cup 150, 152 is coupled to the output of the high voltage pulse source 30.

The positive ions entering each Faraday cup through entrance 160 produce a current in the electrical circuit connected to the Faraday cup. The electrical current is indicative of the number of positive ions received per unit time, or ion current. It is assumed that the ion currents received by Faraday cups 150, 152 have a fixed relation to the number of ions implanted in wafer 20 per unit time. Depending on the uniformity of plasma 40 and the uniformity of ion acceleration toward platen 14, the ion current per unit area received by each Faraday cup may be substantially equal to or a fixed fraction of the ion current per unit area implanted in wafer 20. This electrical current is measured by current measuring devices 62-1, 62-2 which provide the current measurement to the dose processor 70. Since the electrical current output of each of the Faraday cups is representative of the ion current implanted in wafer 20, the Faraday cups 150, 152 and the current measurement devices 62-1, 62-2, provide a measurement of the ion dose or current implanted in wafer 20. In the pulsed system of FIG. 10, the current output of Faraday cups 150, 152 includes a displacement current component as described above.

The dose processor 70 receives the output from the current measurement devices 61-1, 62-along with the measurement of the secondary current in the secondary capacitor C2. The subtraction of the secondary current from the current measured by the Faraday cups may be performed within the dose processor 70. Alternatively, the current measurement devices 62-1, 62-2 may be incorporated into the dose processor where current measurement and subtraction is performed within the dose processor 70.

In the previously described embodiments, secondary capacitor C2 was set to have the same capacitance as the primary capacitor C1 defined by the anode 24 and the cathode 14. In the embodiment of FIG. 10, the secondary capacitor C2 is set to have the same capacitance as the total capacitance of the Faraday cups. The secondary capacitor C2 is separately connected to pulse source 30 to ensure that the current measured represents only the current delivered to capacitor C2.

The process for setting the value of the secondary capacitor the same as the capacitance of the Faraday cups is analogous to the above description of tuning the system. As above, this tuning can be performed with or without plasma being present. In addition, any necessary noise reduction techniques can be applied to the signals being measured.

As the Faraday cups are relatively small devices, their capacitance is likely to be smaller than the capacitance of the anode and the cathode. It is feasible, however, that a secondary capacitor having a value k times as large as the capacitance of the Faraday cups can be used. One of ordinary skill in the art will understand that the removal of the displacement current from the current measured by the Faraday cup must account for this factor k. For example, if the secondary capacitor C2 is k times as large as the capacitance of the Faraday cups, the signal from capacitor C2 may be reduced by a factor k. This approach requires that the value of the capacitance of the Faraday cups be known.

In yet another embodiment, the value of the primary capacitance can be determined and the displacement current through the primary capacitance having the voltage pulse applied to it can be simulated using circuit simulation programs known in the art. The simulated displacement current, synchronized with the voltage pulse, can be subtracted from an actual current measurement in an operating plasma processing system. Such a calculation may be easily performed in a computer-based signal processing system.

Figure 13:
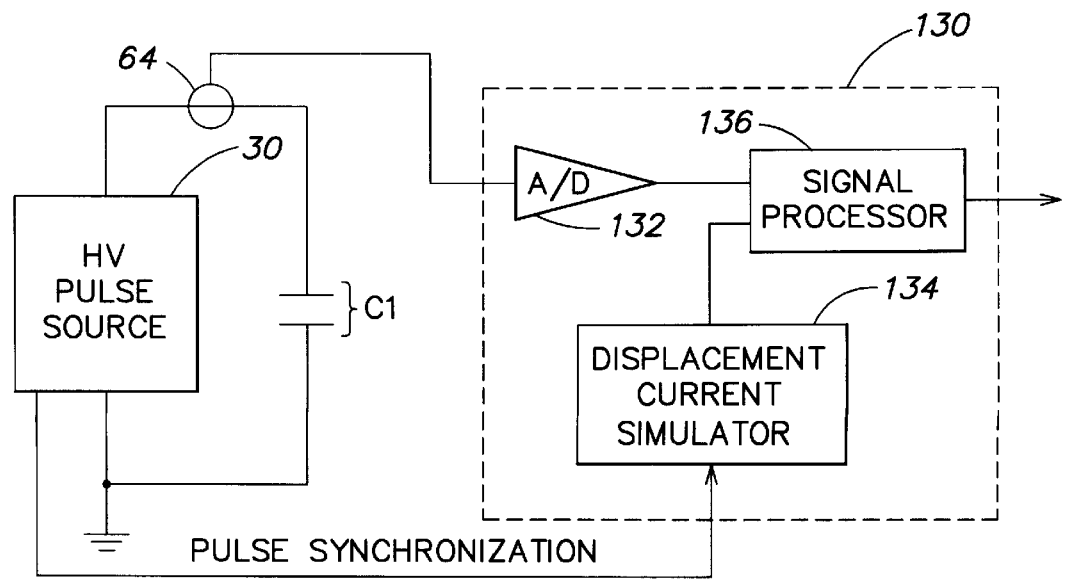
FIG. 13 is a schematic block diagram of a plasma doping system in accordance with a seventh embodiment of the present invention.

In such an implementation, as shown in FIG. 13, measurements from device 64 and a pulse synchronization signal are provided to simulation system 130. System 130 includes an analog-to-digital converter (ADC) 132 to convert the current measurement signal and to provide a digital output to a signal processor 136. A displacement current simulator 134 is programmed to output to a signal processor 136 a digital representation of the displacement current component in synchronization with the pulse from pulse source 30. Signal processor 136 subtracts the output of displacement current simulator 134 from the output of ADC 132 to provide an accurate ion current measurement.

Variations of the system shown in FIG. 13 are included within the scope of the present invention. An analog simulation of the displacement current can be subtracted from the analog measurement of the current. The simulated analog displacement current can be generated by a computer based simulation program driving an analog-to-digital converter, or the signal can be generated by a circuit configured to output a representation of the displacement current. All of these implementations are within the expertise of one of ordinary skill in the art. Using a simulated displacement current removes the need for the secondary capacitance C2 and thus simplifies the equipment, while providing an accurate current measurement.

The invention has been described thus far in connection with a plasma doping system in which a plasma is formed upon the application of a high voltage pulse between platen 14 and anode 24. The present invention may also be utilized in a plasma immersion system wherein a plasma is present continuously in the region between the anode and the cathode, and ions are accelerated toward the cathode by application of a high voltage pulse.

In the configuration of FIG. 1, anode 24 is separate from but electrically connected to chamber 10. In other configurations, the conductive walls of the plasma doping chamber 10 may serve as an anode, and a separate anode is not utilized.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method of measuring an ion current in a plasma processing system for implanting ions into a target in a plasma processing chamber, said plasma processing system including first and second electrodes, wherein a voltage pulse is applied across the first and second electrodes, the method comprising:

(a) electrically coupling a capacitor between the first and second electrodes to receive the voltage pulse and selecting the capacitor to have a same or nearly the same capacitance as a first capacitance between the first and second electrodes;

(b) measuring a first current supplied to the first and second electrodes during the voltage pulse and providing a first current signal representative of the first current;

(c) measuring a second current supplied to the capacitor during the voltage pulse and providing a second current signal representative of the second current; and (d) subtracting the second current signal from the first current signal to provide an ion current signal representative of the ion current.

2. The method of claim 1, further comprising:

measuring a first voltage across the first and second electrodes present during the voltage pulse;

measuring a second voltage across the capacitor pre sent during the voltage pulse; and adjusting at least one of the first and second current signals to compensate for a difference between the first and second voltages.

3. The method of claim 1, further comprising:

removing noise from at least one of the first and second current signals.

4. The method of claim 1, wherein the plasma processing system is a plasma doping system and wherein the voltage pulse forms the plasma and accelerates ions in the plasma toward a target.

5. The method of claim 1, wherein the plasma processing system is a continuous plasma system and wherein the voltage pulse accelerates ions in the plasma toward a target.

6. The method of claim 1, further comprising:

varying the capacitance value of the capacitor to minimize a displacement current component of the ion current signal.

7. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse, the capacitive device comprising a capacitor having a capacitance value the same or nearly the same as a capacitance between the first and second electrodes;

first means for measuring a first current supplied to the first and second electrodes during the voltage pulse and for providing a first current signal representative of the first current;

second means for measuring a second current supplied to the capacitive device during the voltage pulse and for providing a second current signal representative of the second current; and means for subtracting the second current signal from the first current signal to provide a measurement of the ion current in the plasma processing system.

8. The apparatus of claim 7, wherein the first and second means each comprise a Pearson coil.

9. The apparatus of claim 7, wherein the plasma processing system is a plasma doping system and wherein the voltage pulse forms the plasma and accelerates ions in the plasma toward a target.

10. The apparatus of claim 7, wherein the plasma processing system is a continuous plasma system and wherein the voltage pulse accelerates ions in the plasma toward a target.

11. The apparatus of claim 7, wherein the capacitor is a variable capacitor.

12. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse, the capacitive device comprising a capacitor having a capacitance value the same or nearly the same as a capacitance between the first and second electrodes;

a first current measuring device to measure a first current provided to the first and second electrodes during the voltage pulse and to output a first current signal representative of the first current;

a second current measuring device, coupled to the capacitive device, to measure a second current provided thereto during the voltage pulse and to output a second current signal representative of the second current; and a subtractor to receive the first and second current signals and to subtract the second current signal from the first current signal to provide a measurement of the ion current.

13. The apparatus of claim 12, wherein the capacitor is a variable capacitor.

14. The apparatus of claim 12, wherein the plasma processing system is a plasma doping system and wherein the voltage pulse forms the plasma and accelerates ions in the plasma toward a target.

15. The apparatus of claim 12, wherein the plasma processing system is a continuous plasma system and wherein the voltage pulse accelerates ions in the plasma toward a target.

16. A method of measuring an ion current in a plasma processing system for implanting ions into a target in a plasma processing chamber, said plasma processing system including first and second electrodes, wherein a voltage pulse is applied across the first and second electrodes, the method comprising:

(a) electrically coupling a capacitor between the first and second electrodes to receive the voltage pulse and selecting the capacitor to have a capacitance different from a first capacitance between the first and second electrodes;

(b) measuring a first current supplied to the first and second electrodes during the voltage pulse and providing a first current signal representative of the first current;

(c) measuring a second current supplied to the capacitor during the voltage pulse and providing a second current signal representative of the second current; and (e) subtracting the second current signal from the first current signal to provide an ion current signal representative of the ion current.

17. A method of measuring an ion current in a plasma processing system for implanting ions into a target in a plasma processing chamber, said plasma processing system including first and second electrodes, wherein a voltage pulse is applied across the first and second electrodes and a target is disposed on the first electrode, the method comprising:

(a) electrically coupling a capacitor between the first and second electrodes to receive the voltage pulse;

(b) measuring a first current supplied to the first and second electrodes during the voltage pulse and providing a first current signal representative of the first current, the step of providing the first current signal comprising placing an ion detecting device adjacent the target to generate the first current signal;

(c) measuring a second current supplied to the capacitor during the voltage pulse and providing a second current signal representative of the second current;

(d) selecting the capacitor to have a capacitance different from a capacitance of the ion detecting device; and (f) subtracting the second current signal from the first current signal to provide an ion current signal representative of the ion current.

18. A method of measuring an ion current in a plasma processing system for implanting ions into a target in a plasma processing chamber, said plasma processing system including first and second electrodes, wherein a voltage pulse is applied across the first and second electrodes, the method comprising:

(a) electrically coupling a capacitor between the first and second electrodes to receive the voltage pulse;

(b) measuring a first current supplied to the first and second electrodes during the voltage pulse and providing a first current signal representative of the first current, the step of providing the first current signal comprising placing an ion detecting device adjacent the target to generate the first current signal;

(c) measuring a second current supplied to the capacitor during the voltage pulse and providing a second current signal representative of the second current;

(d) selecting the capacitor to have a capacitance substantially the same as a capacitance of the ion detecting device; and (e) subtracting the second current signal from the first current signal to provide an ion current signal representative of the ion current.

19. The method of claim 17, wherein the plasma processing system is a plasma doping system and wherein the voltage pulse forms the plasma and accelerates ions in the plasma toward a target.

20. The method of claim 17, wherein the plasma processing system is a continuous plasma system and wherein the voltage pulse accelerates ions in the plasma toward a target.

21. The method of claim 17, wherein the ion detecting device comprises a Faraday cup.

22. The method of claim 21, wherein the ion detecting device comprises a Faraday cup.

23. The method of claim 21, wherein the capacitor is a variable capacitor.

24. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse, the capacitive device comprising a capacitor having a capacitance different from a capacitance between the first and second electrodes;

first means for measuring a first current supplied to the first and second electrodes during the voltage pulse and for providing a first current signal representative of the first current;

second means for measuring a second current supplied to the capacitive device during the voltage pulse and for providing a second current signal representative of the second current; and means for subtracting the second current signal from the first current signal to provide a measurement of the ion current in the plasma processing system.

25. The apparatus of claim 24, wherein the capacitor is a variable capacitor.

26. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse;

first means for measuring a first current supplied to the first and second electrodes during the voltage pulse and for providing a first current signal representative of the first current, the capacitive device comprising a capacitor having a capacitance value the same or nearly the same as a capacitance of the first means for measuring the first current;

second means for measuring a second current supplied to the capacitive device during the voltage pulse and for providing a second current signal representative of the second current; and means for subtracting the second current signal from the first current signal to provide a measurement of the ion current in the plasma processing system.

27. The apparatus of claim 26, wherein the first means comprise a Faraday cup.

28. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse, the capacitive device comprising a capacitor having a capacitance value different from a capacitance of the first and second electrodes;

a first current measuring device to measure a first current provided to the first and second electrodes during the voltage pulse and to output a first current signal representative of the first current;

a second current measuring device, coupled to the capacitive device, to measure a second current provided thereto during the voltage pulse and to output a second current signal representative of the second current; and a subtractor to receive the first and second current signals and to subtract the second current signal from the first current signal to provide a measurement of the ion current, the subtractor comprising means for compensating for the difference in capacitance values.

29. The apparatus of claim 28, wherein the capacitor is a variable capacitor.

30. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse;

a first current measuring device to measure a first current provided to the first and second electrodes during the voltage pulse and to output a first current signal representative of the first current, the capacitive device having a capacitance different from a capacitance of the first current measuring device;

a second current measuring device, coupled to the capacitive device, to measure a second current provided thereto during the voltage pulse and to output a second current signal representative of the second current; and a subtractor to receive the first and second current signals and to subtract the second current signal from the first current signal to provide a measurement of the ion current, the subtractor comprising means for compensating for the difference in capacitance values.

31. An apparatus for measuring ion current in a plasma processing system for implanting ions into a target in a plasma processing chamber, said plasma processing system including first and second electrodes, wherein a voltage pulse is applied across the first and second electrodes, the apparatus comprising:

a capacitive device coupled to the first and second electrodes to receive the voltage pulse;

a first current measuring device to measure a first current provided to the first and second electrodes during the voltage pulse and to output a first current signal representative of the first current, the capacitive device having a capacitance substantially the same as a capacitance of the first current measuring device;

a second current measuring device, coupled to the capacitive device, to measure a second current provided thereto during the voltage pulse and to output a second current signal representative of the second current; and a subtractor to receive the first and second current signals and to subtract the second current signal from the first current signal to provide a measurement of the ion current.

32. The apparatus of claim 31, wherein the plasma processing system is a continuous plasma system and wherein the voltage pulse accelerates ions in the plasma toward a target.

33. The apparatus of claim 31, wherein:

the first current measuring device comprises a Faraday cup; and the capacitance device has substantially a same capacitance as that of the Faraday cup.

34. The apparatus of claim 31, wherein the plasma processing system is a plasma doping system and wherein the voltage pulse forms the plasma and accelerates ions in the plasma toward a target.

* * * * *

UNITED STATES PATENT AND TRADEMARK OFFICE
CERTIFICATE OF CORRECTION

PATENT NO.     : 6,433,553 B1
DATED          : August 13, 2002
INVENTOR(S)    : Goeckner et al.

It is certified that error appears in the above-identified patent and that said Letters Patent is hereby corrected as shown below:

<u>Column 12,</u>
Line 41, the term "pre sent" should be replaced by -- present --.

<u>Column 14,</u>
Lines 64 and 66, claims 22 and 23 should be dependent on claim 18.

Signed and Sealed this

Eighth Day of April, 2003

JAMES E. ROGAN
*Director of the United States Patent and Trademark Office*